(12) United States Patent
Wu et al.

(10) Patent No.: US 10,620,516 B2
(45) Date of Patent: Apr. 14, 2020

(54) PROJECTOR, HEAT DISSIPATION MODULE AND HEAT DISSIPATION FIN

(71) Applicant: Coretronic Corporation, Hsin-Chu (TW)

(72) Inventors: Pei-Rong Wu, Hsin-Chu (TW); Shi-Wen Lin, Hsin-Chu (TW); Wen-Yen Chung, Hsin-Chu (TW); Tsung-Ching Lin, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 16/424,403

(22) Filed: May 28, 2019

(65) Prior Publication Data

US 2020/0026167 A1   Jan. 23, 2020

(30) Foreign Application Priority Data

Jul. 23, 2018   (CN) .................... 2018 2 1163541 U

(51) Int. Cl.
| | |
|---|---|
| *G03B 21/16* | (2006.01) |
| *G03B 21/14* | (2006.01) |
| *G02B 27/09* | (2006.01) |
| *F28D 7/00* | (2006.01) |
| *H01L 23/427* | (2006.01) |

(52) U.S. Cl.
CPC .......... *G03B 21/16* (2013.01); *F28D 7/0008* (2013.01); *G02B 27/0955* (2013.01); *G03B 21/142* (2013.01); *H01L 23/427* (2013.01)

(58) Field of Classification Search
CPC .. G03B 21/142; G03B 21/16; G02B 27/0955; F28D 7/0008; F28D 15/0275; H01L 23/427; F28F 1/32; F28F 13/12

USPC ............................. 353/52, 54, 57, 58, 60, 61
See application file for complete search history.

(56) References Cited

U.S. PATENT DOCUMENTS

| | | | | |
|---|---|---|---|---|
| 5,697,432 | A | 12/1997 | Yun et al. | |
| 8,132,807 | B2 * | 3/2012 | Androsyuk | G07D 11/00 |
| | | | | 194/206 |
| 10,114,274 | B2 * | 10/2018 | Wang | F28F 13/12 |
| 10,281,807 | B2 * | 5/2019 | Wang | G03B 21/16 |

(Continued)

FOREIGN PATENT DOCUMENTS

| | | |
|---|---|---|
| CN | 2530236 | 1/2003 |
| CN | 2636421 | 8/2004 |

(Continued)

*Primary Examiner* — William C. Dowling
(74) *Attorney, Agent, or Firm* — JCIPRNET

(57) ABSTRACT

A projector includes a casing, an optical engine module and a heat dissipation module. The optical engine module disposed in the casing includes a light source, a light valve and a projection lens. The heat dissipation module disposed in the casing includes at least two heat pipes and a heat dissipation fin set. The heat dissipation fin set includes at least a heat dissipation fin and at least a turbulent structure. The heat dissipation fin has a surface including a heat pipe arrangement region and a turbulent region adjacent to each other. The at least one heat pipe passes through the heat pipe arrangement region, and an air flowing section is formed near the at least one heat pipe. The turbulent region has a turbulent section corresponding to the air flowing section, and the turbulent structure is disposed in the turbulent region and extends continuously in the turbulent section.

25 Claims, 7 Drawing Sheets

(56) References Cited

U.S. PATENT DOCUMENTS

| | | |
|---|---|---|
| 2001/0037875 A1 | 11/2001 | Guerrero |
| 2006/0169019 A1 | 8/2006 | Kutscher et al. |
| 2010/0282444 A1 | 11/2010 | Lin et al. |
| 2013/0228313 A1 | 9/2013 | Fried |
| 2013/0250517 A1 | 9/2013 | Yang et al. |
| 2016/0178283 A1 | 6/2016 | Wang et al. |
| 2017/0097196 A1 | 4/2017 | Yoo et al. |
| 2018/0196337 A1 | 7/2018 | Wang et al. |

FOREIGN PATENT DOCUMENTS

| | | |
|---|---|---|
| CN | 101986203 | 3/2011 |
| CN | 106200226 | 12/2016 |
| TW | 201623900 | 7/2016 |
| TW | 201826005 | 7/2018 |

* cited by examiner

PROJECTOR, HEAT DISSIPATION MODULE AND HEAT DISSIPATION FIN

CROSS-REFERENCE TO RELATED APPLICATION

This application claims the priority benefit of China application serial no. 201821163541.6, filed on Jul. 23, 2018. The entirety of the above-mentioned patent application is hereby incorporated by reference herein and made a part of this specification.

BACKGROUND

Technical Field

The disclosure relates to a projector, a heat dissipation module and a heat dissipation fin, and in particular to a projector provided with a turbulent structure and a heat dissipation module and a heat dissipation fin of the projector.

Description of Related Art

The projector is a display device for generating a large-sized image. The imaging principle of the projector is to convert an illumination light beam generated by the light source into an image beam by the light valve, and then to project the image beam onto the screen or wall through the projection lens. Since the light source and components such as the light valve in the optical engine of the projector generate heat during operation, a heat dissipation module is required to dissipate heat for these heat generating components, so as to prevent the device from overheating. The heat dissipation module may include a heat dissipation fin set connected to the heat generating components and the heat energy generated by the heat generating components may be transferred to the heat dissipation fin set. The heat energy may then be brought from the heat dissipation fin set to the outside of the projector through a natural convection or a forced convection created by a fan.

With the advancement of projection technology, users' requirements for a high-brightness, low-noise projector are getting higher. In general, the higher the brightness of the light source of a projector is, the more heat the light source generates. In view of this, although the rotation speed of a fan may be increased to enhance a heat dissipation airflow, more noise may be resulted, which contradicts the low noise requirement of a general projector. Alternatively, increasing the size of a heat dissipation fin set to improve the heat dissipation efficiency is also a solution to overcome the abovementioned problems. However, the weight or size of the projector may be relatively increased, resulting in a great reduction in the safety and convenience during installation or usage.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention were acknowledged by a person of ordinary skill in the art.

SUMMARY

The disclosure provides a projector, a heat dissipation module and a heat dissipation fin with improved heat dissipation efficiency.

Other objectives and advantages of the disclosure will be further understood from the technical features disclosed herein.

In order to achieve one or parts or all or other objectives, an embodiment of the disclosure provides a projector including a casing, an optical engine module, and a heat dissipation module. The optical engine module is disposed in the casing and includes a light source, a light valve and a projection lens. The light source is used to generate an illumination light beam. The light valve is used to convert the illumination light beam into an image beam. The projection lens is used to project the image beam. The heat dissipation module is disposed in the casing and includes at least one heat pipe and a heat dissipation fin set. The heat dissipation fin set includes at least one heat dissipation fin and at least one turbulent structure. The heat dissipation fin has a surface including a heat pipe arrangement region and a turbulent region adjacent to each other. The at least one heat pipe passes through the heat pipe arrangement region, and an air flowing section is formed near the at least one heat pipe. The turbulent region has a turbulent section corresponding to the air flowing section, and the turbulent structure is disposed in the turbulent region and extends continuously in the turbulent section.

In order to achieve one or parts or all or other objectives, an embodiment of the disclosure provides a heat dissipation module including at least one heat pipe and a heat dissipation fin set. The heat dissipation fin set includes at least one heat dissipation fin and at least one turbulent structure. The heat dissipation fin has a surface including a heat pipe arrangement region and a turbulent region adjacent to each other. The at least one heat pipe passes through the heat pipe arrangement region, and an air flowing section is formed near the at least one heat pipe. The turbulent region has a turbulent section corresponding to the air flowing section, and the turbulent structure is disposed in the turbulent region and extends continuously in the turbulent section.

In order to achieve one or parts or all or other objectives, an embodiment of the disclosure provides a heat dissipation fin including a surface, at least one heat pipe through hole, and at least one turbulent structure. The surface includes a heat pipe arrangement region and a turbulent region adjacent to each other. The at least one heat pipe through hole is located in the heat pipe arrangement region, and an air flowing section is formed near the at least one heat pipe through hole. The turbulent region has a turbulent section corresponding to the air flowing section, and the turbulent structure is disposed in the turbulent region and extends continuously in the turbulent section.

Based on the above, embodiments of the disclosure have at least one of the following advantages or effects. In the abovementioned embodiments of the disclosure, the turbulent structure continuously extends in the air flowing section on the heat dissipation fin, so that the heat dissipation airflow flowing through the air flowing section can pass through the turbulent structure and a boundary layer thereof can be disrupted by the turbulent structure, so as to enhance the heat convection efficiency of the heat dissipation airflow. As a result, the heat dissipation effect of the heat dissipation module can be effectively improved without increasing the fan speed and the size of the heat dissipation fin set, so that the design trend for a projector with a high brightness, a low noise and a small size is achieved.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
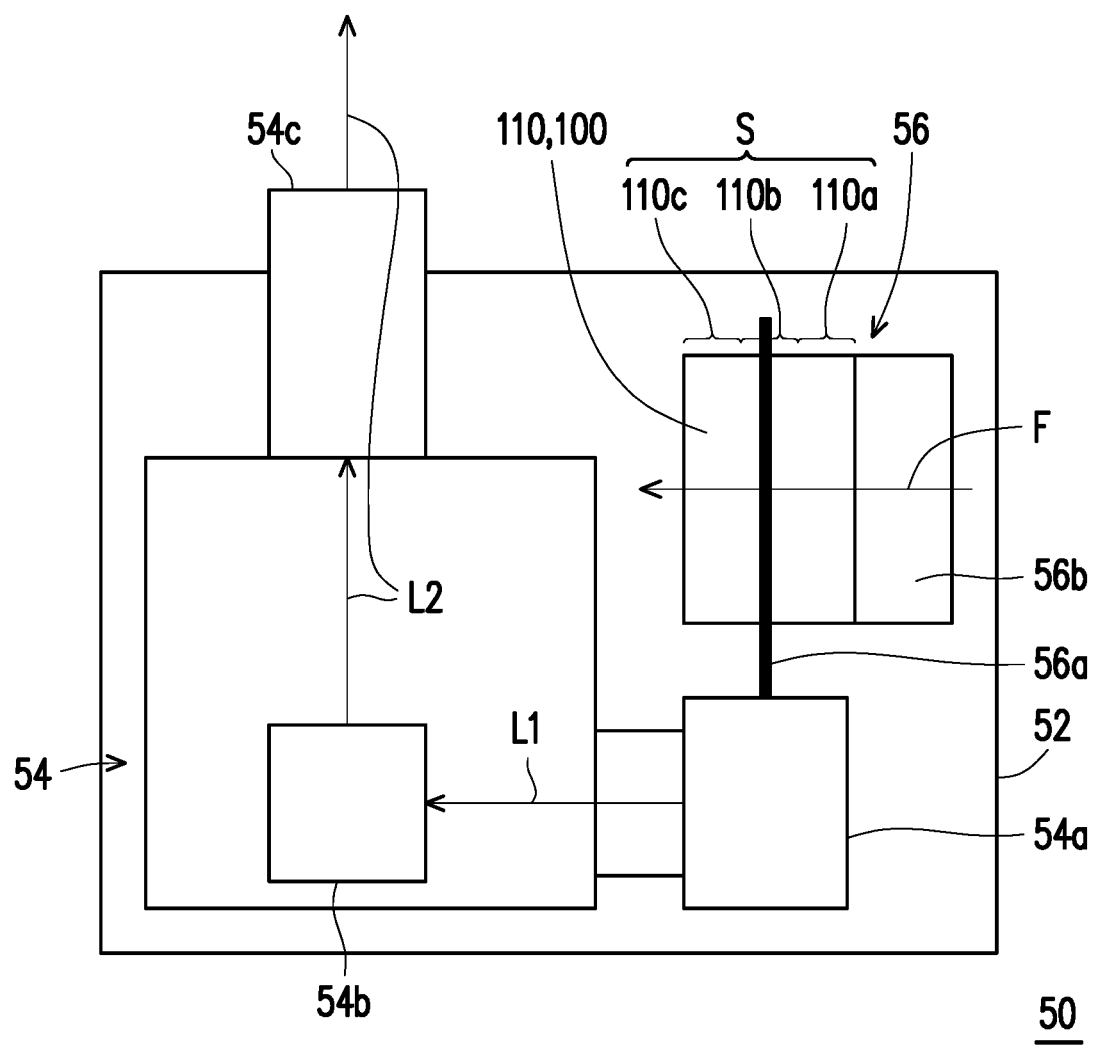
FIG. 1 is a schematic view of a projector according to an embodiment of the disclosure.

FIG. 1 is a schematic view of a projector of an embodiment of the disclosure. Referring to FIG. 1, the projector 50 of the present embodiment includes a casing 52, an optical engine module 54, and a heat dissipation module 56. The optical engine module 54 is disposed in the casing 52, and the optical engine module 54 includes a light source 54a, a light valve 54b, and a projection lens 54c. The light source 54a is used to generate an illumination light beam L1, the light valve 54b is used to convert the illumination light beam L1 into an image beam L2, and the projection lens 54c projects the image beam L2 to the outside of the projector 50. In the present embodiment, the heat dissipation module 56 is disposed in the casing 52 and is used to dissipate heat from the light source 54a. It should be recognized that the heat dissipation module 56 may be connected to any kind of heat source, and a heat dissipation effect may be achieved by the heat dissipation module 56 for the heat source.

Specifically, in the present embodiment, the heat dissipation module 56 includes a heat dissipation fin set 100, a plurality of heat pipes 56a (one is shown in FIG. 1), and a fan 56b. In the present embodiment, the heat pipes 56a are connected to the light source 54a and the heat dissipation fin set 100 and is used to transfer the heat generated by the light source 54a to the heat dissipation fin set 100 through a heat conduction and/or a heat convection. In the present embodiment, the fan 56b is connected to the heat dissipation fin set 100 and is used to provide a heat dissipation airflow F so that the heat dissipation airflow F passes through the heat dissipation fin set 100 and the heat is dissipated. In the present embodiment, in the direction in which the heat dissipation airflow F flows, the heat dissipation fin set 100 is located between the fan 56b and the projection lens 54c, and the heat dissipation fin set 100 is located between the fan 56b and the optical engine module 54. However, the disclosure is not limited thereto.

In view of the above, the fan 56b of FIG. 1, for example, blows air to the heat dissipation fin set 100 so as to make the heat dissipation airflow F pass through the heat dissipation fin set 100 in a direction shown from the right to the left of the page. However, the location of the fan 56b is not limited to where shown in FIG. 1 of the disclosure. For example, in another embodiment that is not shown, the fan 56b of FIG. 1 may also be located between the heat dissipation fin set 100 and the projection lens 54c, and the fan 56b may draw air from the heat dissipation fin set 100 to make the heat dissipation airflow F pass through the heat dissipation fin set 100 in a direction shown from the right to the left of the page, which means the heat dissipation airflow F generated by the fan 56b may dissipate heat by making the heat dissipation airflow F pass through the heat dissipation fin set 100. In other embodiments that are not shown, the fan 56b may also be disposed at other suitable locations to provide/generate the heat dissipation airflow F to make the heat dissipation airflow F pass through the heat dissipation fin set 100.

Figure 2:
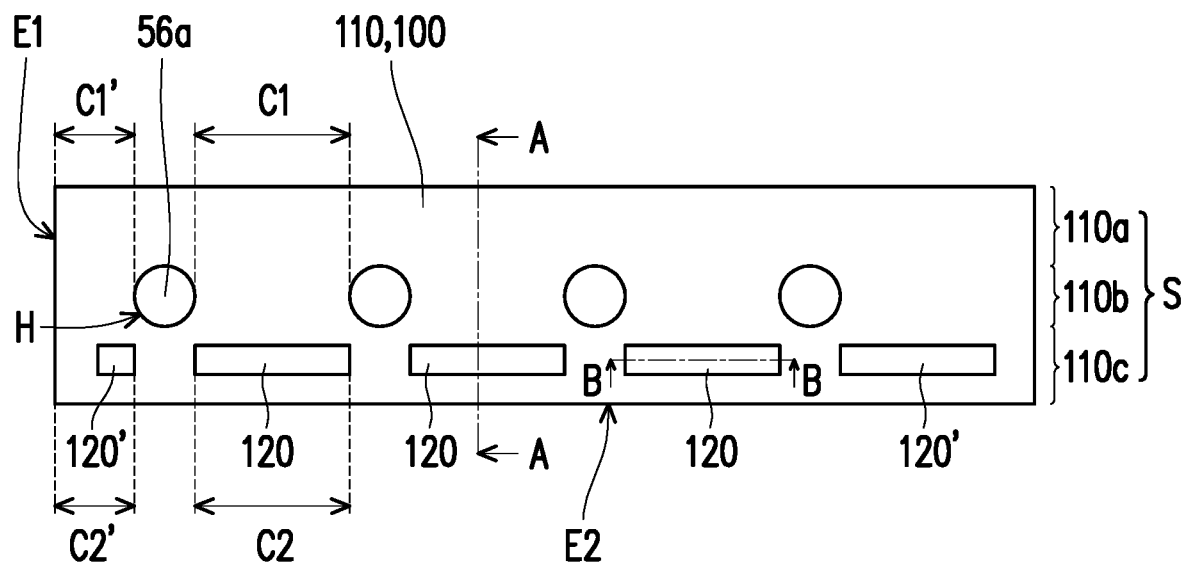
FIG. 2 is a side view of the heat dissipation fin set and the heat pipe of FIG. 1.
Figure 3:
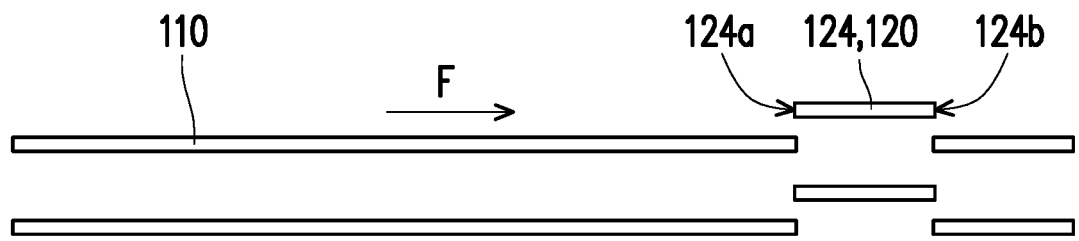
FIG. 3 is a cross-sectional view of the heat dissipation fin set of FIG. 2 taken along line A-A.
Figure 4:
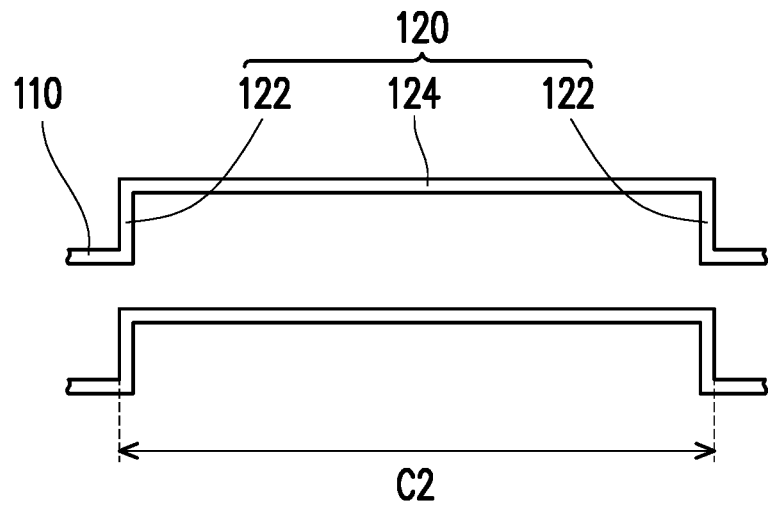
FIG. 4 is a cross-sectional view of the heat dissipation fin set of FIG. 2 taken along line B-B.

FIG. 2 is a side view of the heat dissipation fin set and the heat pipes of FIG. 1. FIG. 3 is a cross-sectional view of the heat dissipation fin set of FIG. 2 taken along line A-A. FIG. 4 is a cross-sectional view of the heat dissipation fin set of FIG. 2 taken along line B-B. Referring to FIG. 2 to FIG. 4, the heat dissipation fin set 100 of the present embodiment includes a plurality of heat dissipation fins 110 and a plurality of turbulent structures 120. Although FIGS. 3 and 4 illustrate only two heat dissipation fins 110 as an example, the heat dissipation fin set 100 may actually contain more heat dissipation fins 110. These heat dissipation fins 110 are stacked one on another as shown in FIGS. 3 and 4.

In the present embodiment, each heat dissipation fin 110 has a surface S, which, as shown in FIG. 2, includes a non-turbulent region 110a, a heat pipe arrangement region 110b and a turbulent region 110c, for example. The heat pipe arrangement region 110b is located between the turbulent region 110c and the non-turbulent region 110a, the non-turbulent region 110a is adjacent to the heat pipe arrangement region 110b, and the turbulent region 110c is adjacent to the heat pipe arrangement region 110b. In the present embodiment, the turbulent structure 120 is not disposed in the non-turbulent region 110a. Each heat pipe 56a passes through the heat pipe arrangement region 110b through a heat pipe through hole H formed in the heat pipe arrangement region 110b. These turbulent structures 120 are disposed in the turbulent region 110c, and each turbulent structure 120 is, for example, integrally formed with the heat dissipation fin 110, for example, by stamping. Alternatively, each turbulent structure 120 is fixed to the heat dissipation fin 110 by bonding (such as welding). Nevertheless, the disclosure is not limited thereto. Besides, regarding one single heat dissipation fin 110, the turbulent structure 120 can be considered as a structure included in the heat dissipation fin 110.

It should be appreciated that the flow direction of the heat dissipation airflow F generated by the fan 56b may be directed into the interior of the projector 50 as shown in FIG. 1. In other embodiments, the heat dissipation airflow F may flow in a direction to the outside of the projector 50 depending on the configuration of the fan 56b. In both of the above configurations, the heat dissipation airflow F flows through the non-turbulent region 110a and the heat pipe arrangement region 110b first, and then through the turbulent region 110c. Therefore, when the heat dissipation airflow F flows along the direction to the outside of the projector 50, the arrangement of the heat dissipation module 56 may be left-right reversed relative to what shown in FIG. 1.

As shown in FIG. 1, in the present embodiment, on the surface S of the heat dissipation fin 110, the non-turbulent region 110a is located between the fan 56b and the heat pipe arrangement region 110b, and the heat pipe arrangement region 110b is located between the fan 56b and the turbulent region 110c, such that the heat dissipation airflow F may flow from the non-turbulent region 110a to the heat pipe arrangement region 110b and then flow from the heat pipe arrangement region 110b to the turbulent region 110c. That is, in the present embodiment, regarding the direction of the flow path of the heat dissipation airflow F, the non-turbulent region 110a, the heat pipe arrangement region 110b, and the turbulent region 110c are sequentially the upstream region, the midstream region, and the downstream region.

Referring to FIG. 2, an air flowing section C1 is formed near the heat pipe 56a. That is, the air flowing section C1 is formed near the heat pipe through hole H. Further, the air flowing section C1 is formed between any two adjacent heat pipes 56a. That is, the air flowing section C1 is formed between the adjacent two heat pipe through holes H. The turbulent region 110c has a turbulent section C2 corresponding to the air flowing section C1, and the turbulent structure 120 is disposed in the turbulent region 110c and continuously extends in the turbulent section C2. In this configuration, the heat dissipation airflow F flowing through the air flowing section C1 can pass through the turbulent structure 120 such that the boundary layer of the heat dissipation airflow F is disrupted by the turbulent structure 120 to enhance the turbulence and to increase the heat convection coefficient on the surface S of the heat dissipation fin 110, so as to take away the heat generated by more heat sources. As a result, the heat dissipation effect of the heat dissipation module 56 can be effectively improved without increasing the fan speed of the fan 56b or the size of the heat dissipation fin set 100, so that the design trend for a projector 50 with a high brightness, a low noise and a small size is achieved. In addition, in the present embodiment, since the turbulent structure is not disposed in the upstream region (the non-turbulent region 110a) or the midstream region (the heat pipe arrangement region 110b) of the heat dissipation airflow F, the situation that the turbulent structure disposed in the upstream region or the midstream region disturbs the flow of the heat dissipation airflow F and the situation that the turbulent structure disposed in the upstream region or the midstream region reduces the efficiency of the heat dissipation airflow F flowing to the downstream region can be avoided.

Specifically, the adjacent two heat pipes 56a of the present embodiment define two boundaries opposite to each other of the air flowing section C1. That is, the adjacent two heat pipe through holes H define opposite two boundaries of the air flowing section C1. The opposite two end portions of the turbulent section C2 are respectively located at the two boundaries of the air flowing section C1, and each of the turbulent structures 120 continuously extends from one end portion of the corresponding turbulent section C2 to the other end portion thereof, so as to make the extension range of each turbulent structure 120 fully cover the range of the air flowing section C1.

Referring to FIG. 4, in the present embodiment, each turbulent structure 120 includes two supporting portions 122 and a connecting portion 124. The two supporting portions 122 respectively protrude from both end portions of the turbulent section C2, and the connecting portion 124 is connected between the two supporting portions 122. In other embodiments, the turbulent structure 120 may have other suitable shapes, and the disclosure is not intended to limit the shape of the turbulent structure 120. The direction in which the two supporting portions 122 protrude is parallel to the extension direction of the heat pipe 56a.

Figure 5:
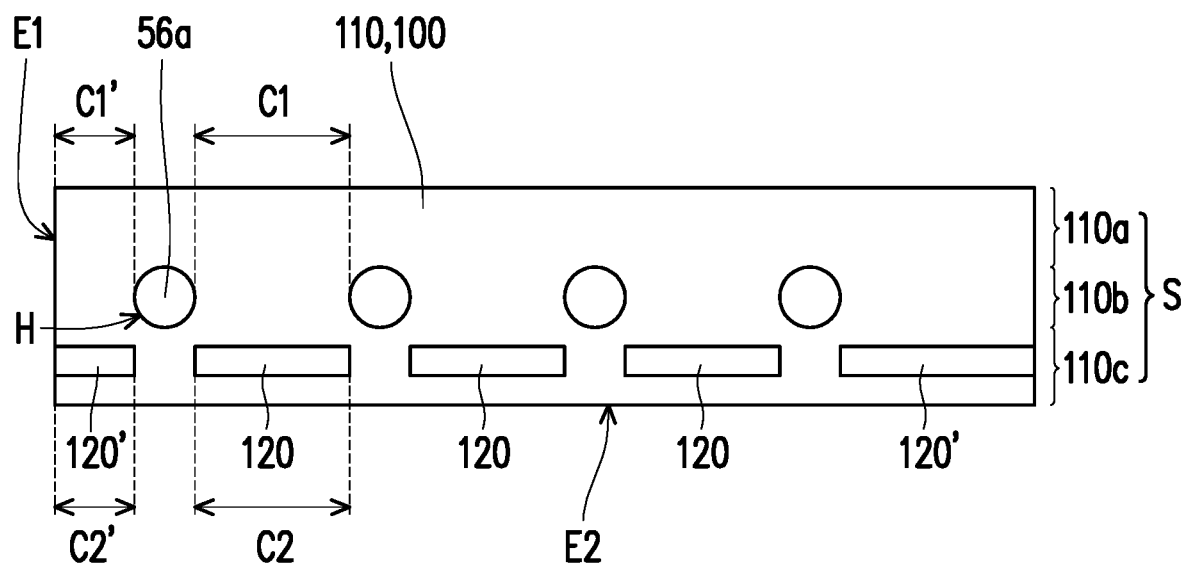
FIG. 5 is a side view of a heat dissipation fin set and a heat pipe of another embodiment of the disclosure.

Referring to FIG. 2, in the present embodiment, another air flowing section C1' is formed between the heat pipe 56a near the side E1 of the heat dissipation fin 110 and the side E1 of the heat dissipation fin 110. That is, the air flowing section C1' is formed between the heat pipe through hole H near the side E1 of the heat dissipation fin 110 and the side E1 of the heat dissipation fin 110. The turbulent region 110c has a turbulent section C2' corresponding to the air flowing section C1'. The heat dissipation fin set 100 includes a turbulent structure 120' on the turbulent region 110c of each heat dissipation fin 110, and the turbulent structure 120' does not extend to the side E1 in the turbulent section C2'. Therefore, the heat dissipation fin 110 can be clamped at the side E1 during the manufacture process so that the turbulent structure 120 can be easily fabricated. However, the disclosure is not limited thereto, and another example is described below with reference to the drawings. FIG. 5 is a side view of a heat dissipation fin set and a heat pipe of another embodiment of the disclosure. The difference between the embodiments shown in FIG. 5 and FIG. 2 is that the turbulent structure 120' continuously extends to the side E1 in the turbulent section C2', making the extension range of the turbulent structure 120' fully cover the range of the air flowing section C1'.

Figure 6:
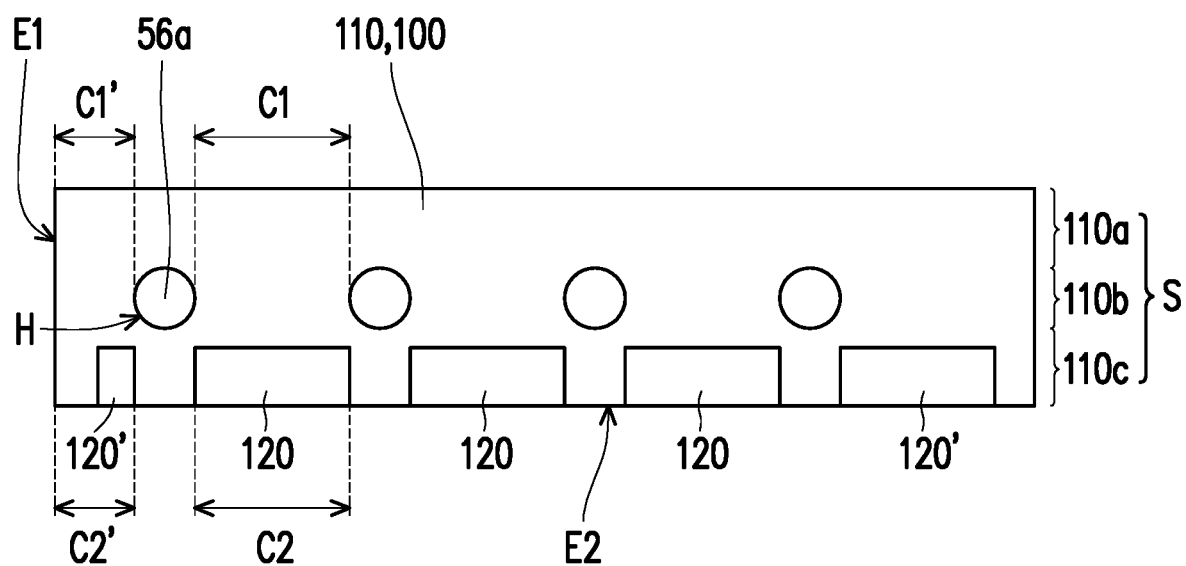
FIG. 6 is a side view of a heat dissipation fin set and a heat pipe of another embodiment of the disclosure.

In the embodiment shown in FIG. 2, during the process of the heat dissipation airflow F (as shown in FIGS. 1 and 3) flowing through the turbulent structure 120, the heat dissipation airflow F passes through one end of 124a of the turbulent structure 120 (as shown in FIG. 3) first, and then passes through the other end 124b of the turbulent structure 120 (as shown in FIG. 3) to generate the turbulence twice sequentially on the surface S of the heat dissipation fin 11. However, the disclosure is not limited thereto, and another example is described below with reference to the drawings. FIG. 6 is a side view of a heat dissipation fin set and a heat pipe of another embodiment of the disclosure. The difference between the embodiment shown in FIG. 6 and the embodiment shown in FIG. 2 is that both the turbulent structure 120 and the turbulent structure 120' extend to the edge E2 of the heat dissipation fin 110, and the edge E2 is perpendicular to the side E1. The turbulent region 110c is located between the edge E2 and the heat pipe arrangement region 110b. Although this arrangement allows the heat dissipation airflow that passes through the turbulent structure 120 to generate the turbulence only once on the surface S of the heat dissipation fin 110, the resistance and pressure drop caused by the turbulent structure 120 may be reduced.

Figure 7A:
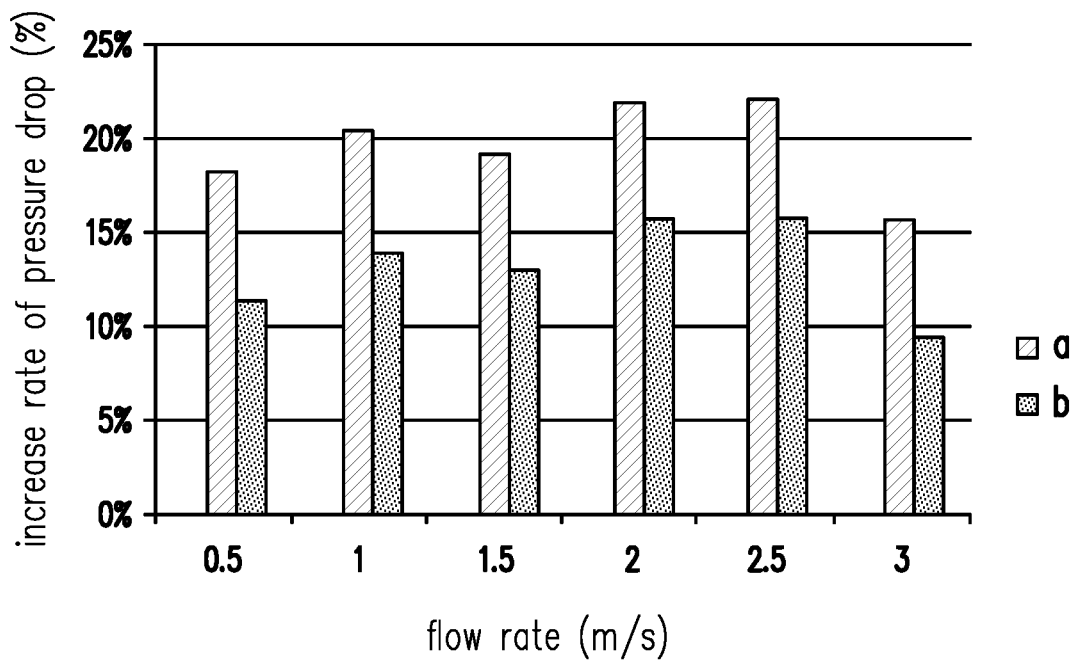
FIG. 7A illustrates the increase rates of pressure drops of the heat dissipation fin set of FIG. 2 and the heat dissipation fin set of FIG. 6.
Figure 7B:
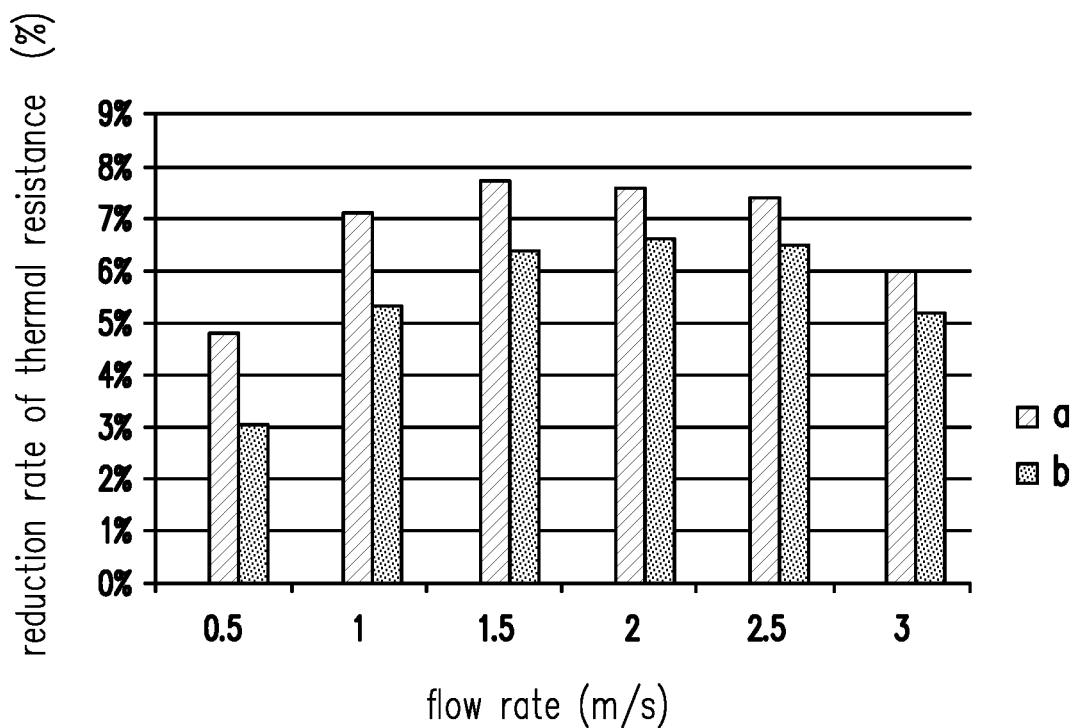
FIG. 7B illustrates the reduction rates of thermal resistances of the heat dissipation fin set of FIG. 2 and the heat dissipation fin set of FIG. 6.

FIG. 7A illustrates the increase rates of pressure drops of the heat dissipation fin set of FIG. 2 and the heat dissipation fin set of FIG. 6. As shown in FIG. 7A, as for various flow rates of the heat dissipation airflows, the increase rates of pressure drops of the heat dissipation fin set 100 of FIG. 2 (corresponding to a in FIG. 7A) and the heat dissipation fin set 100 of FIG. 6 (corresponding to b in FIG. 7A) are both less than 25%. FIG. 7B illustrates the reduction rates of thermal resistances of the heat dissipation fin set of FIG. 2 and the heat dissipation fin set of FIG. 6. As shown in FIG. 7B, as for various flow rates of the heat dissipation airflows, the reduction rates of thermal resistances of the heat dissipation fin set 100 of FIG. 2 (corresponding to a in FIG. 7B) and the heat dissipation fin set 100 of FIG. 6 (corresponding to b in FIG. 7B) are both greater than 3%.

Figure 8:
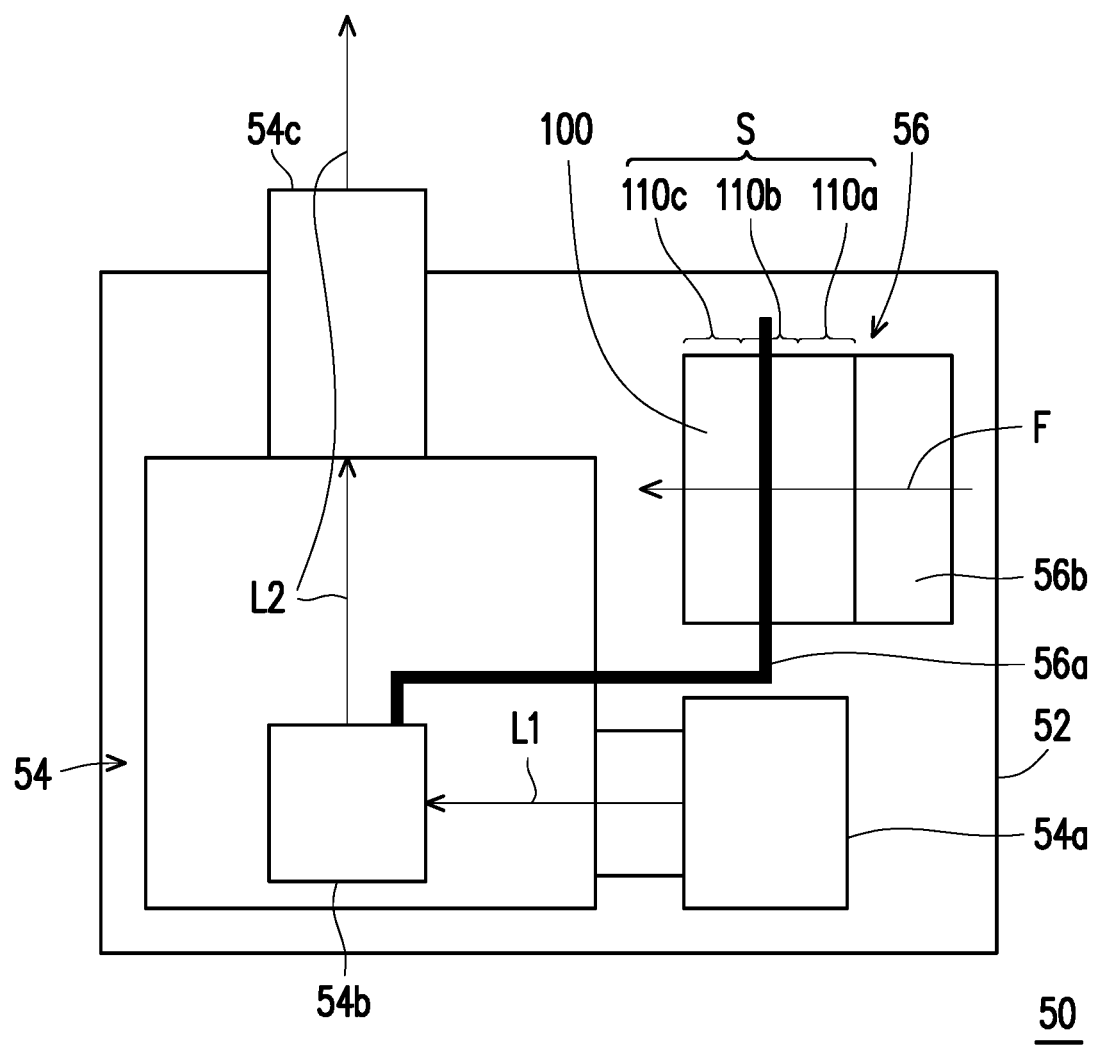
FIG. 8 is a schematic view of a projector of another embodiment of the disclosure.

FIG. 8 is a schematic view of a projector of another embodiment of the disclosure. The difference between the embodiment of FIG. 8 and the embodiment of FIG. 1 is that the heat dissipation module 56 of FIG. 1 is used to dissipate heat from the light source 54a, while the heat dissipation module 56 of FIG. 8 is used to dissipate heat from the light valve 54b. Specifically, in the embodiment of FIG. 8, the heat pipe 56a is not connected to the light source 54a but to the light valve 54b. In other embodiments, the heat pipe may be connected to other types of heat sources, and the disclosure is not limited thereto.

Figure 9:
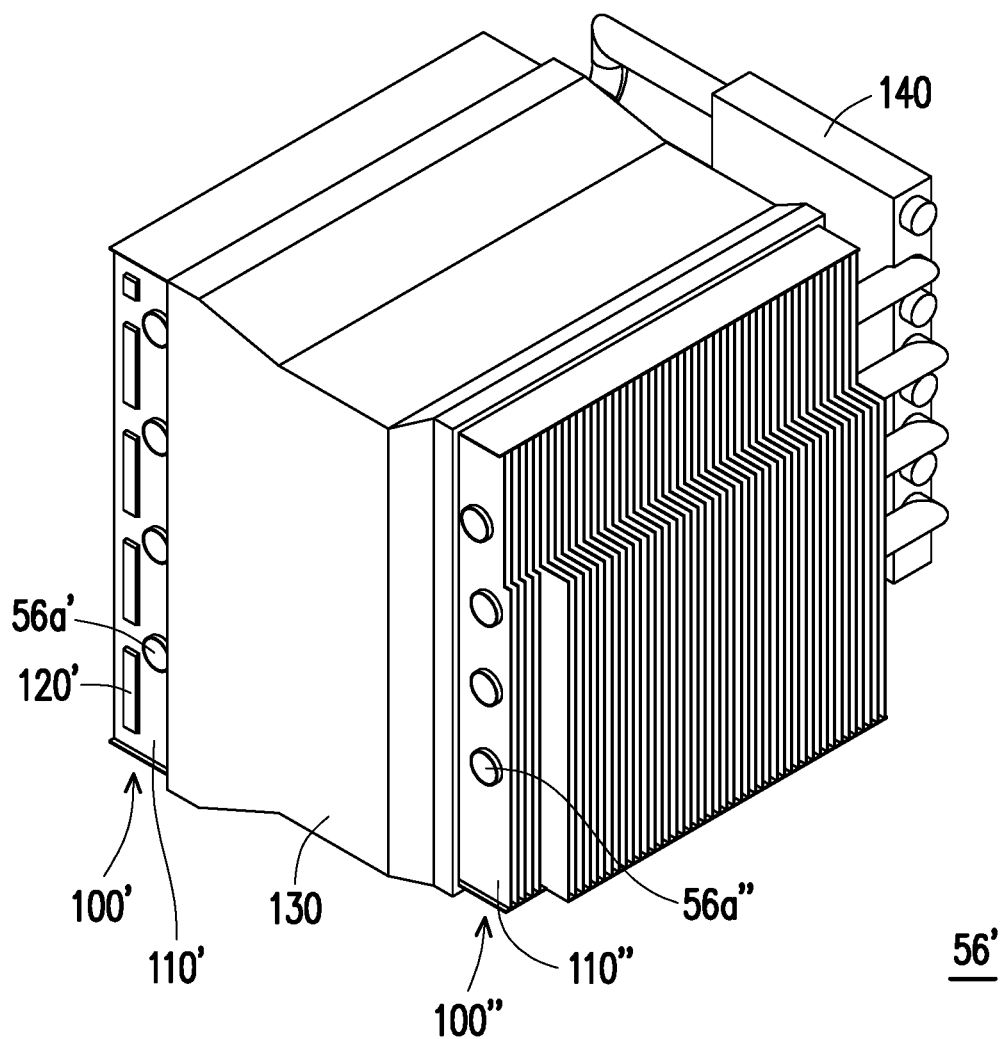
FIG. 9 is a perspective view of a heat dissipation module of another embodiment of the disclosure.

FIG. 9 is a perspective view of a heat dissipation module of another embodiment of the disclosure. In the heat dissipation module 56' shown in FIG. 9, the heat dissipation fin set 100' is juxtaposed with the heat dissipation fin set 100". The fan is installed, for example, inside the casing 130 between the heat dissipation fin set 100' and the heat dissipation fin set 100". The heat dissipation fin 110' of the heat dissipation fin set 100' and the turbulent structure 120' are similar to the heat dissipation fin 110 of the heat dissipation fin set 100 and the turbulent structure 120 of the aforementioned embodiment, and the heat dissipation fin set 100" and the heat dissipation fin 110" thereof do not have a turbulent structure. The heat pipe 56a' and the heat pipe 56a" are respectively disposed through the heat dissipation fin set 100' and the heat dissipation fin set 100", and are connected to a heat conducting member 140 to be connected to the heat source (not shown) through the heat conducting member 140. In other embodiments, the heat dissipation fin set 100" and the heat dissipation fin 110" thereof may also have a turbulent structure similar to the turbulent structure 120', but the disclosure is not limited thereto.

In summary, the embodiments of the disclosure have at least one of the following advantages or effects. In the abovementioned embodiments of the disclosure, the turbulent structure continuously extends in the air flowing region on the heat dissipation fin, so that the heat dissipation airflow flowing through the air flowing section can pass through the turbulent structure and the boundary layer thereof can be disrupted by the turbulent structure to enhance the turbulence, so as to increase the heat convection efficiency of the heat dissipation airflow. As a result, the heat dissipation effect of the heat dissipation module can be effectively improved without increasing the fan speed and the size of the heat dissipation fin set, so that the design trend for a projector with a high brightness, a low noise and a small size is achieved.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A projector comprising: a casing, an optical engine module and a heat dissipation module, wherein,
the optical engine module is disposed in the casing and the optical engine module comprises a light source, a light valve and a projection lens, wherein,
the light source is configured to generate an illumination light beam;
the light valve is configured to convert the illumination light beam into an image beam; and
the projection lens is configured to project the image beam; and
the heat dissipation module is disposed in the casing and comprises at least one heat pipe and a heat dissipation fin set, wherein,
the heat dissipation fin set comprises at least one heat dissipation fin and at least one turbulent structure, wherein the heat dissipation fin has a surface comprising a heat pipe arrangement region and a turbulent region adjacent to each other, the at least one heat pipe passes through the heat pipe arrangement region, an air flowing section is formed near the at least one heat pipe, the turbulent region has a turbulent section corresponding to the air flowing section, and the at least one turbulent structure is disposed in the turbulent region and extends continuously in the turbulent section.

2. The projector according to claim 1, wherein the at least one heat pipe comprises two heat pipes, and the two heat pipes define two boundaries opposite to each other of the air flowing section, opposite two end portions of the turbulent section are respectively located at the two boundaries of the air flowing section, and the at least one turbulent structure continuously extends from one end portion of the turbulent section to the other end portion of the turbulent section.

3. The projector according to claim 2, wherein one of the at least one turbulent structure comprises two supporting portions and a connecting portion, and the two supporting portions respectively protrude from the two end portions of the turbulent section, and the connecting portion is connected between the two supporting portions.

4. The projector according to claim 1, wherein the heat dissipation fin set comprises another turbulent structure, another air flowing section is formed between the at least one heat pipe and a side of the heat dissipation fin, the turbulent region has another turbulent section corresponding to the another air flowing section, and the another turbulent structure is disposed in the turbulent region and extends continuously in the another turbulent section.

5. The projector according to claim 1, wherein the surface of the heat dissipation fin further comprises a non-turbulent region, the heat pipe arrangement region is located between the turbulent region and the non-turbulent region, and the at least one turbulent structure is not disposed in the heat pipe arrangement region and the non-turbulent region.

6. The projector according to claim 1, wherein the number of the at least one heat dissipation fin is more than one, and these heat dissipation fins are stacked upon one another.

7. The projector according to claim 1, wherein one of the at least one turbulent structure is integrally connected to one of the at least one heat dissipation fin.

8. The projector according to claim 1, wherein the heat dissipation fin has an edge, the turbulent region is located between the edge and the heat pipe arrangement region, and the turbulent structure extends to the edge.

9. The projector according to claim 1, wherein the heat dissipation module further comprises a fan, the fan is configured to provide a heat dissipation airflow, and the heat dissipation airflow flows from the heat pipe arrangement region to the turbulent region.

10. The projector according to claim 1, wherein the at least one heat pipe is connected to the light source or the light valve.

11. A heat dissipation module comprising at least one heat pipe and a heat dissipation fin set, wherein,
the heat dissipation fin set comprises at least one heat dissipation fin and at least one turbulent structure, wherein the heat dissipation fin has a surface comprising a heat pipe arrangement region and a turbulent region adjacent to each other, the at least one heat pipe passes through the heat pipe arrangement region, an air flowing section is formed near the at least one heat pipe, the turbulent region has a turbulent section corresponding to the air flowing section, and the at least one turbulent structure is disposed in the turbulent region and continuously extends in the turbulent section.

12. The heat dissipation module according to claim 11, wherein the at least one heat pipe comprises two heat pipes, the two heat pipes define e two boundaries opposite to each other of the air flowing section, opposite two end portions of the turbulent section are respectively located at the two boundaries of the air flowing section, and at least one the turbulent structure continuously extends from one end portion of the turbulent section to the other end portion of the turbulent section.

13. The heat dissipation module according to claim 12, wherein one of the at least one turbulent structure comprises two supporting portions and a connecting portion, the two supporting portions respectively protrude from the two end portions of the turbulent section, and the connecting portion is connected between the two supporting portions.

14. The heat dissipation module according to claim 11, wherein the heat dissipation fin set comprises another turbulent structure, another air flowing section is formed between the at least one heat pipe and a side of the heat dissipation fin, the turbulent region has another turbulent section corresponding to the another air flowing section, and the another turbulent structure is disposed in the turbulent region and extends continuously in the another turbulent section.

15. The heat dissipation module according to claim 11, wherein the surface of the heat dissipation fin further comprises a non-turbulent region, the heat pipe arrangement region is located between the turbulent region and the non-turbulent region, and the at least one turbulent structure is not disposed in the heat pipe arrangement region and the non-turbulent region.

16. The heat dissipation module according to claim 11, wherein the number of the at least one heat dissipation fin is more than one, and these heat dissipation fins are stacked upon one another.

17. The heat dissipation module according to claim 11, wherein one of the at least one turbulent structure is integrally connected to one of the at least one heat dissipation fin.

18. The heat dissipation module according to claim 11, wherein the heat dissipation fin has an edge, the turbulent region is located between the edge and the heat pipe arrangement region, and the turbulent structure extends to the edge.

19. The heat dissipation module according to claim 11, further comprising a fan, the fan is configured to provide a heat dissipation airflow, and the heat dissipation airflow flows from the heat pipe arrangement region to the turbulent region.

20. A heat dissipation fin comprising a surface, at least one heat pipe through hole and at least one turbulent structure, wherein,
the surface comprises a heat pipe arrangement region and a turbulent region adjacent to each other;
the at least one heat pipe through hole is located in the heat pipe arrangement region, wherein an air flowing section is formed near the at least one heat pipe through hole, and the turbulent region has a turbulent section corresponding to the air flowing section; and
the at least one turbulent structure is disposed in the turbulent region and extends continuously in the turbulent section.

21. The heat dissipation fin according to claim 20, wherein the at least one heat pipe through hole comprises two hear pipe through holes, the two hear pipe through holes define two boundaries of the air flowing section opposite to each other, opposite two end portions of the turbulent section are respectively located at the two boundaries of the air flowing section, and the turbulent structure continuously extends from one end portion of the turbulent section to the other end portion of the turbulent section.

22. The heat dissipation fin according to claim 21, wherein one of the at least one turbulent structure comprises two supporting portions and a connecting portion, the two supporting portions respectively protrude from the two end portions of the turbulent section, and the connecting portion is connected between the two supporting portions.

23. The heat dissipation fin according to claim 20, comprising another turbulent structure, wherein another air flowing section is formed between the at least one heat pipe through hole and a side of the heat dissipation fin, the turbulent region has another turbulent section corresponding to the another air flowing section, and the another turbulent structure is disposed in the turbulent region and extends continuously in the another turbulent section.

24. The heat dissipation fin according to claim 20, wherein the surface of the heat dissipation fin further comprises a non-turbulent region, the heat pipe arrangement region is located between the turbulent region and the non-turbulent region, and the at least one turbulent structure is not disposed in the heat pipe arrangement region and the non-turbulent region.

25. The heat dissipation fin according to claim 20, wherein the heat dissipation fin has an edge, the turbulent region is located between the edge and the heat pipe arrangement region, and the turbulent structure extends to the edge.

* * * * *